United States Patent [19]
Ramalingam

[11] Patent Number: 6,009,829
[45] Date of Patent: Jan. 4, 2000

[54] APPARATUS FOR DRIVING THE ARC IN A CATHODIC ARC COATER

[75] Inventor: Subbiah Ramalingam, Roseville, Minn.

[73] Assignee: United Technologies Corporation, Hartford, Conn.

[21] Appl. No.: 08/919,133

[22] Filed: Aug. 30, 1997

[51] Int. Cl.⁷ .................................................. C23C 14/00
[52] U.S. Cl. ................................ 118/723 VE; 204/298.41
[58] Field of Search ................ 204/298.41; 118/723 VE, 118/723 HC

[56] References Cited

U.S. PATENT DOCUMENTS

| | | | |
|---|---|---|---|
| 3,625,848 | 12/1971 | Snaper ..................................... | 204/192 |
| 3,783,231 | 1/1974 | Sablev et al. .......................... | 219/123 |
| 3,793,179 | 2/1974 | Sablev et al. .......................... | 204/298 |
| 3,836,451 | 9/1974 | Snaper ..................................... | 204/298 |
| 4,492,845 | 1/1985 | Kljuchko et al. ...................... | 219/121 P |
| 4,609,564 | 9/1986 | Pinkhasov ................................ | 427/37 |
| 4,673,477 | 6/1987 | Ramalingam et al. ............. | 204/192.38 |
| 4,724,058 | 2/1988 | Morrison, Jr. ....................... | 204/192.38 |
| 4,849,088 | 7/1989 | Veltrop et al. .......................... | 204/298 |
| 4,859,489 | 8/1989 | Pinkhasov ................................ | 427/37 |
| 4,869,203 | 9/1989 | Pinkhasov .............................. | 118/723 |
| 4,924,135 | 5/1990 | Pinkhasov .............................. | 313/326 |
| 4,929,321 | 5/1990 | Buhl ....................................... | 204/192.38 |
| 4,942,844 | 7/1990 | Pinkhasov .............................. | 118/723 |
| 4,978,556 | 12/1990 | Pinkhasov ................................ | 427/37 |
| 5,011,638 | 4/1991 | Pinkhasov ................................ | 264/59 |
| 5,037,522 | 8/1991 | Vergason ............................ | 204/298.41 |
| 5,045,344 | 9/1991 | Pinkhasov ................................ | 427/37 |
| 5,126,030 | 6/1992 | Tamagaki et al. .................. | 204/192.38 |
| 5,221,349 | 6/1993 | Tamagaki ............................. | 118/708 |
| 5,234,561 | 8/1993 | Randhawa et al. ................. | 204/192.38 |
| 5,269,896 | 12/1993 | Munemasa et al. ................ | 204/192.38 |
| 5,269,898 | 12/1993 | Welty .................................. | 204/298.41 |
| 5,279,723 | 1/1994 | Falabella et al. ................... | 204/192.38 |
| 5,282,944 | 2/1994 | Sanders et al. ...................... | 204/192.38 |
| 5,306,408 | 4/1994 | Treglio ................................ | 204/192.38 |
| 5,317,235 | 5/1994 | Treglio ................................ | 315/111.41 |
| 5,441,624 | 8/1995 | Chan et al. ......................... | 204/298.41 |
| 5,458,754 | 10/1995 | Sathrum et al. .................... | 204/192.38 |
| 5,468,363 | 11/1995 | Falabella ............................ | 204/298.41 |
| 5,480,527 | 1/1996 | Welty .................................. | 204/192.38 |
| 5,518,597 | 5/1996 | Storer et al. ........................ | 204/192.38 |
| 5,580,669 | 12/1996 | Beers et al. ........................... | 428/660 |
| 5,588,975 | 12/1996 | Hammond et al. ....................... | 51/293 |
| 5,840,163 | 11/1998 | Welty .................................. | 204/298.41 |

OTHER PUBLICATIONS

Randhawa, H. and Johnson, P.C. "Technical Note: A Review of Cathodic Arc Plasma Deposition Processes and Their Applications." *Surface and Coatings Technology*, 31 (1987), pp. 303–318. Elsevier Sequoia.

*Primary Examiner*—Thi Dang
*Attorney, Agent, or Firm*—Richard D. Getz

[57] ABSTRACT

An apparatus for applying material by cathodic arc vapor deposition to a substrate is provided which includes a vessel, apparatus for maintaining a vacuum in the vessel, a disk-shaped cathode, apparatus for selectively sustaining an arc of electrical energy between the cathode and an anode, and apparatus for driving the arc around an axially extending evaporative surface of the cathode. The apparatus for driving the arc includes a magnetic field generator attached to a ferromagnetic center piece. The magnetic field generator includes a plurality of side magnets attached to the ferromagnetic center piece, and a center magnet positioned radially inside of the side magnets. Each side magnet produces a magnetic field that permeates the cathode, and each magnetic field includes a portion that runs substantially parallel to the evaporative surface. The center magnet influences the axial position of the arc path relative to the evaporative surface.

7 Claims, 3 Drawing Sheets

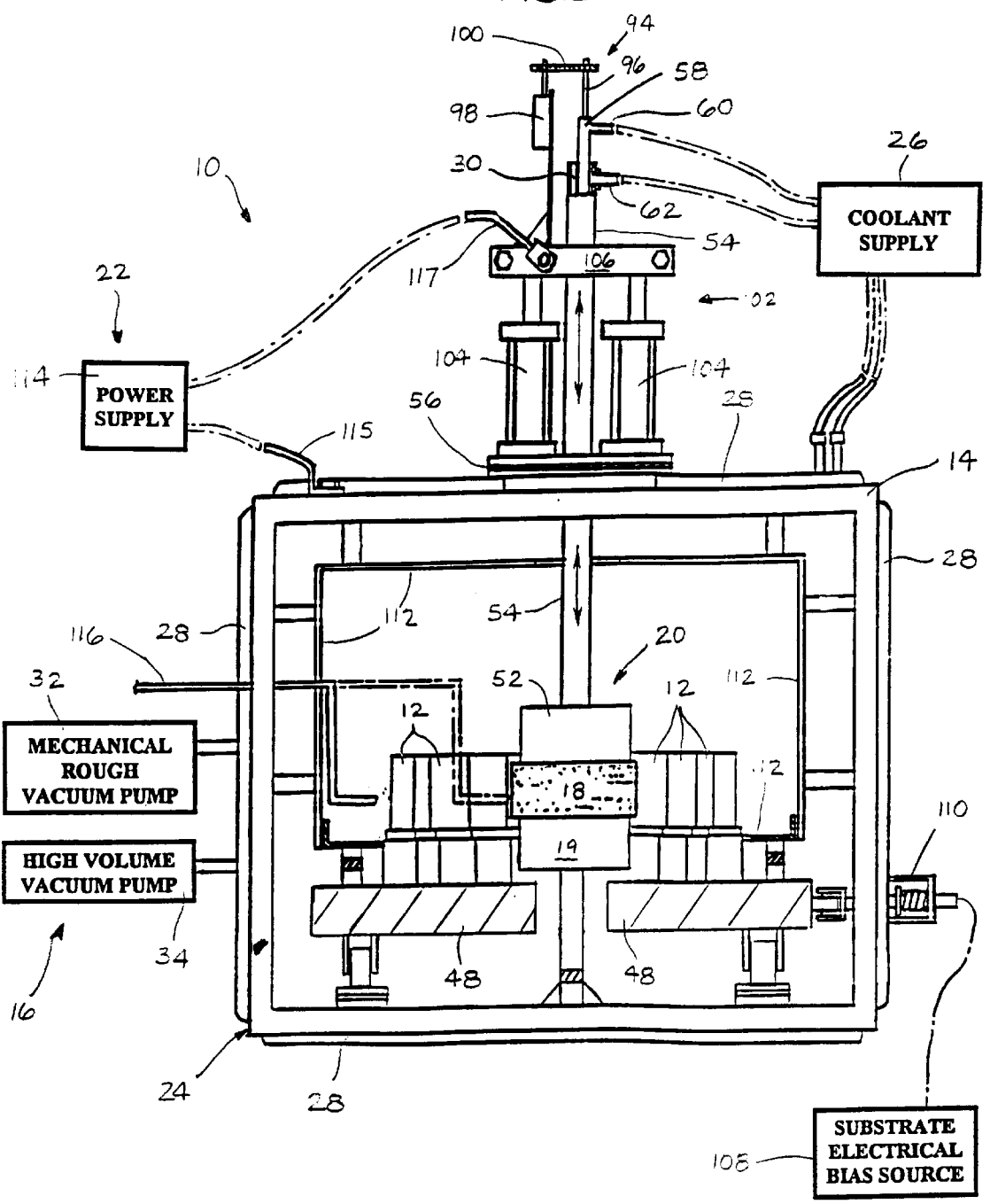

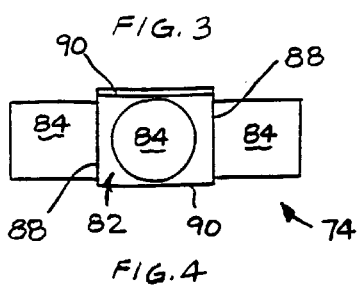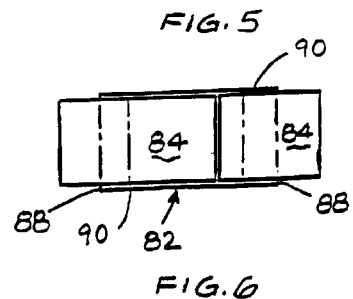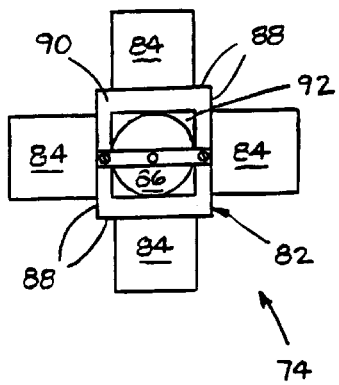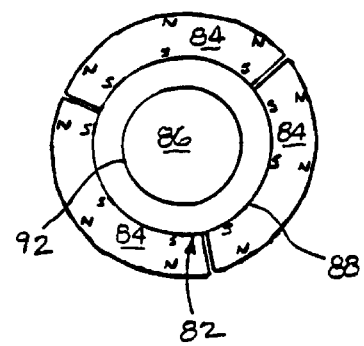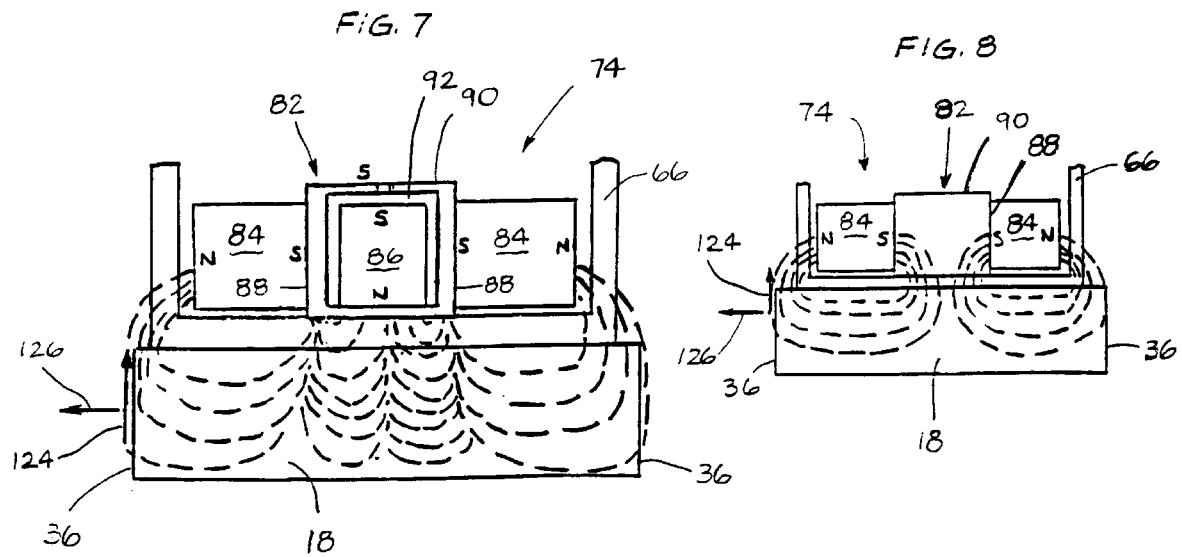

APPARATUS FOR DRIVING THE ARC IN A CATHODIC ARC COATER

BACKGROUND OF THE INVENTION

1. Technical Field

This invention relates to apparatus for vapor deposition of coatings in general, and to cathodic arc vapor deposition apparatus in particular.

2. Background Information

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in a evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current (DC) power supply is attached to the source material (hereinafter referred to as the "cathode") and the positive lead is attached to an anodic member. An arc-initiating trigger, at or near the same electrical potential as the anode, contacts the cathode and subsequently moves away from the cathode. When the trigger is still in close proximity to the cathode, the difference in electrical potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

The energy deposited by the arc at a cathode spot is intense; on the order of $10^5$ to $10^7$ amperes per square centimeter with a duration of a few to several microseconds. The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted toward any object within the deposition chamber having a negative electrical potential relative to the positively charged ion. Some deposition processes maintain the substrate to be coated at the same electrical potential as the anode. Other processes use a biasing source to lower the potential of the substrate and thereby make the substrate relatively more attractive to the positively charged ions. In either case, the substrate becomes coated with the vaporized material liberated from the cathode.

The random movement of the arc can sometimes lead to nonuniform erosion of the cathode, which in turn can limit the useful life of the cathode. To avoid non-uniform erosion, it is known to steer the arc relative to the cathode. U.S. Pat. Nos. 4,673,477, 4,849,088, and 5,037,522 are examples of patents that disclose apparatus for steering an arc relative to a cathode. Some prior art steers the arc by mechanically manipulating a magnetic field source relative to the cathode. Other prior art steers the arc by alternately electrically connecting a power supply lead between two ends of a cathode. In both these approaches, the speed of the arc relative to the cathode is limited by the speed of the apparatus manipulating the magnetic field source, or switching the power supply. Another limitation is the complexity of the switching mechanisms and the hardware neccesary to manipulate a magnetic field source relative to the cathode. A person of skill in the art will recognize that a production coating environment is harsh and simplicity generally equates with reliability.

Presently available cathodic arc coaters typically use a cooled cathode fixed in place within the coater. One cooling scheme provides a manifold attached to the cathode that permits the passage of coolant between the cathode and manifold. Another scheme uses coolant piping connected to a hollow cathode. A problem with either scheme is that the cathode must be machined to accept the manifold or piping. Not all cathode materials are amenable to machining and even where possible, machining adds significantly to the cost of the consumable cathode. Another problem with "directly cooling" the cathode is the labor required to replace the cathode when its useful life has expired. In the previous example where a manifold (or piping) is mechanically attached to the cathode, the manifold (or piping) must be detached from the old cathode and attached to a new one, and the deposition chamber subsequently cleaned of coolant. For those applications which require cathode replacement after each coating run, the labor costs and down time can be considerable. Still another problem with direct cathode cooling is leakage. Coolant leakage occurring during deposition can contaminate the substrates being coated and require extensive cleaning within the deposition chamber. Airfoils for gas turbine engines are an example of an expensive substrate to be coated; one where it would be a distinct advantage to minimize or eliminate losses due to contamination.

In short, what is needed is an apparatus for cathodic arc vapor deposition of material on a substrate that operates efficiently, one capable of consistently providing a high quality coating on a substrate, one that optimizes cathode erosion, and one that operates cost effectively.

DISCLOSURE OF THE INVENTION

It is, therefore, an object of the present invention to provide an apparatus for cathodic arc vapor deposition of material on a substrate that operates in a cost effective manner.

It is another object of the present invention to provide an apparatus for cathodic arc vapor deposition of material on a substrate that provides a uniform high quality coating on every substrate within the apparatus.

It is another object of the present invention to provide an apparatus for cathodic arc vapor deposition of material on a substrate that includes apparatus for steering an arc relative to a cathode that overcomes the limitations of the prior art.

According to the present invention, an apparatus for applying material by cathodic arc vapor deposition to a substrate is provided which includes a vessel, means for maintaining a vacuum in the vessel, a disk-shaped cathode, means for selectively sustaining an arc of electrical energy between the cathode and an anode, and means for steering the arc around the cathode. The arc of electrical energy extending between the cathode and the anode liberates a portion of the cathode which is subsequently deposited on the substrate located inside the vessel.

An advantage of the present invention is that the present invention apparatus for cathodic arc vapor deposition of material on a substrate is designed to operate in a cost effective manner. One cost effective characteristic of the present invention is the cathode. The present invention cathode is preferably disk-shaped and can be cut, for example, from a cylindrical casting. The simply formed cathode requires minimal expensive machining, thereby reducing the cost of the cathode and the overall coating process. Another cost effective characteristic is that the erosion of the cathode is circumferentially uniform. As a result, the life of the cathode can be maximized before replacement is necessary.

Another advantage of the present invention is uniformity of the coating process. The means for steering the arc around the cathode increases the uniformity of the cathode erosion. Specifically, steering the arc around the circumference of the cathode at a substantially constant velocity causes uniform circumferential erosion of cathode. The substrates disposed around and equally spaced from the cathode consequently receive a more uniform deposition of coating. In addition, the velocity of the arc around the cathode circumference is a function of the strength of the magnetic field and the amount of current supplied. As a result, the velocity of the arc can be manipulated by changing the amount of current, the strength of the magnetic field, or both.

Another advantage of the present invention is the simplicity and reliability of the means for steering the arc around the cathode. The means for steering the arc includes a magnetic field generator having a plurality of side magnets and a ferromagnetic centerpiece; no switching mechanism is required. The absense of a switching mechanism increases the reliability of the steering means.

These and other objects, features and advantages of the present invention will become apparent in light of the detailed description of the best mode embodiment thereof, as illustrated in the accompanying drawings.

BEST MODE FOR CARRYING OUT THE INVENTION

I. Apparatus

Figure 1:
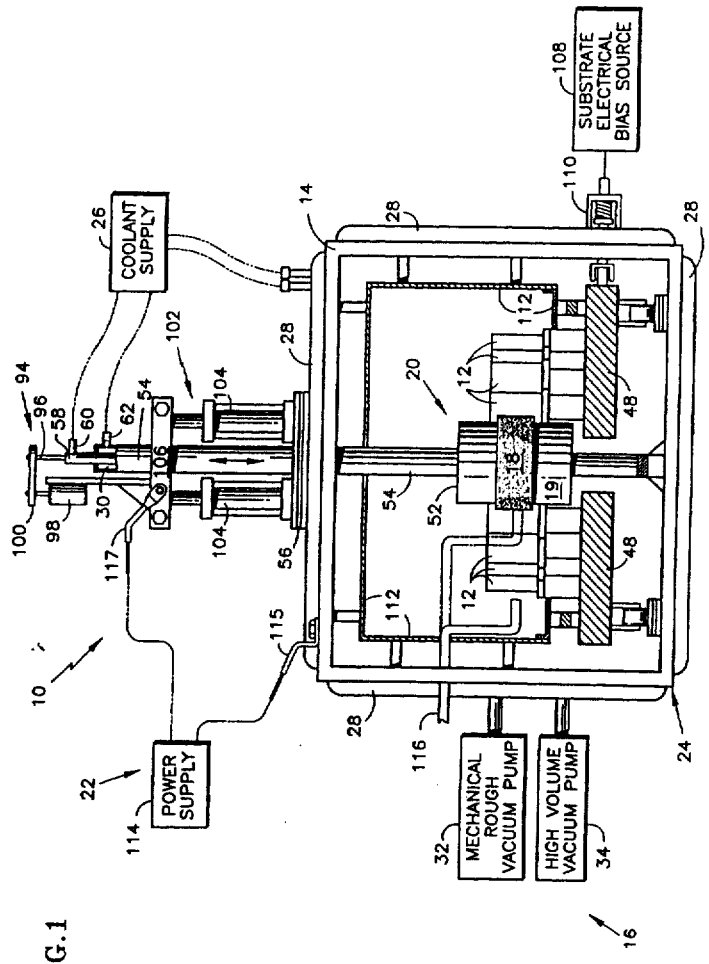
FIG. 1 is a diagrammatic view of the present invention cathodic arc vapor deposition apparatus.
Figure 3:
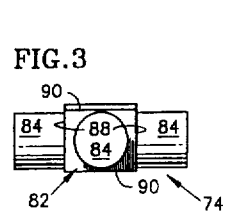
FIG. 3 is a diagrammatic side view of a magnetic field generator.
Figure 5:
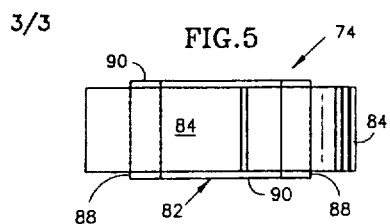
FIG. 5 is a diagrammatic top view of a magnetic field generator having annular side magnets.
Figure 4:
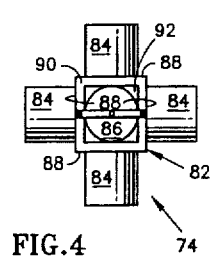
FIG. 4 is a top view of the magnetic field generator shown in FIG. 3.
Figure 6:
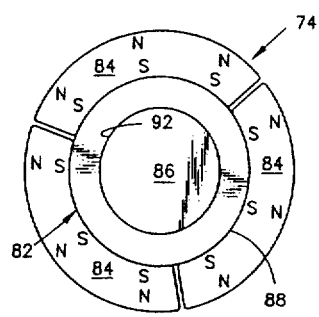
FIG. 6 is a side view of the magnetic field generator shown in FIG. 5.

Referring to FIG. 1, an apparatus 10 for cathodic arc vapor deposition on a substrate 12, hereinafter referred to as a "cathodic arc coater", is provided having a vessel 14, means 16 for maintaining a vacuum in the vessel 14, a cathode 18, a contactor 20, and means 22 for sustaining an arc of electrical energy between the cathode 18 and an anode 24. A coolant supply 26 maintains the apparatus 10 within acceptable temperatures by cycling coolant through cooling passages 28,30 within the vessel 14 and contactor 20. In the preferred embodiment, the means 16 for maintaining a vacuum in the vessel 14 includes a mechanical rough vacuum pump 32 and a high volume diffusion-type vacuum pump 34 piped to the interior of the vessel 24. Other vacuum means may be used alternatively.

Figure 2:
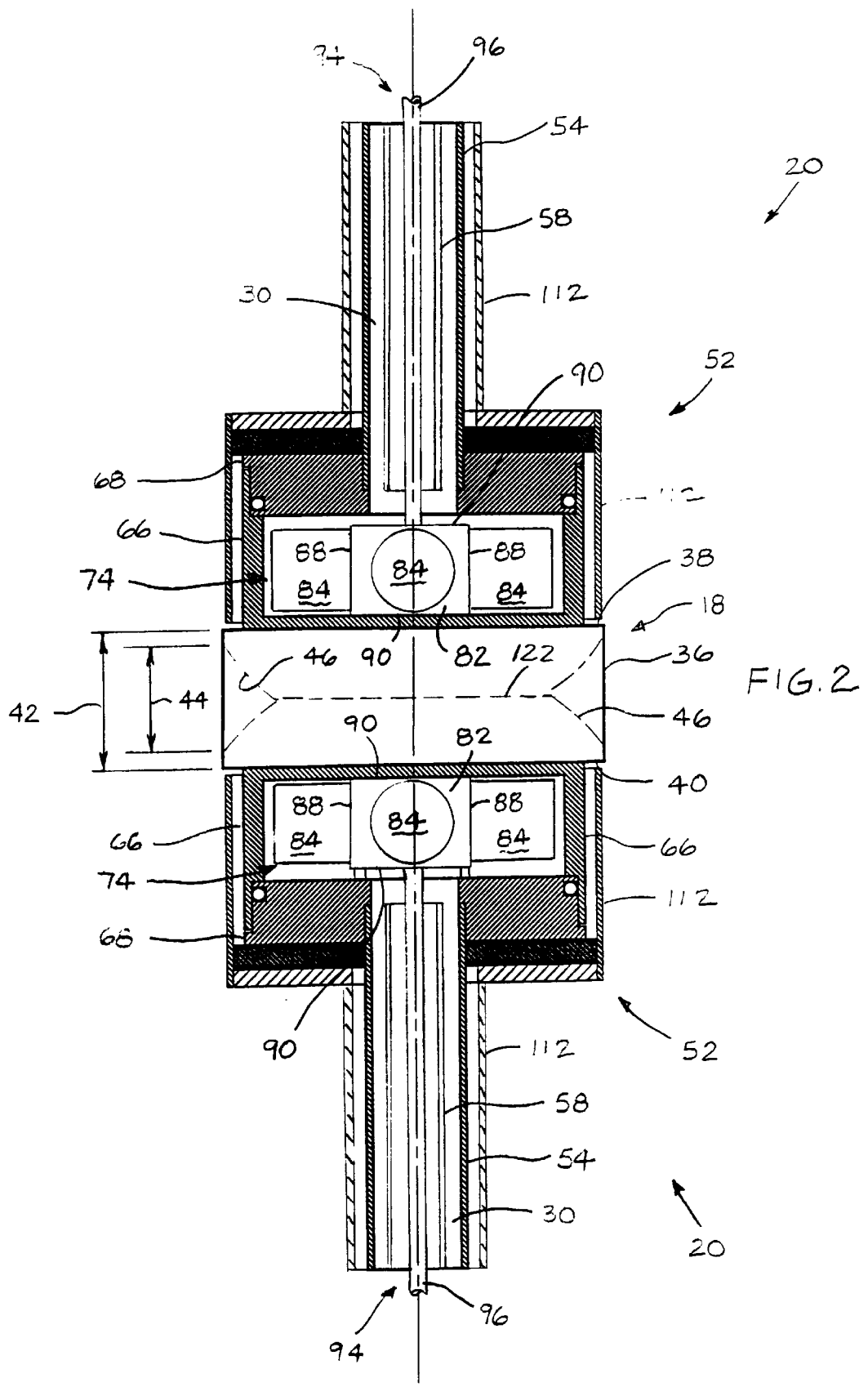
FIG. 2 is a diagrammatic cross-sectional view of a contactor, showing twin magnetic field generators.
Figure 2:
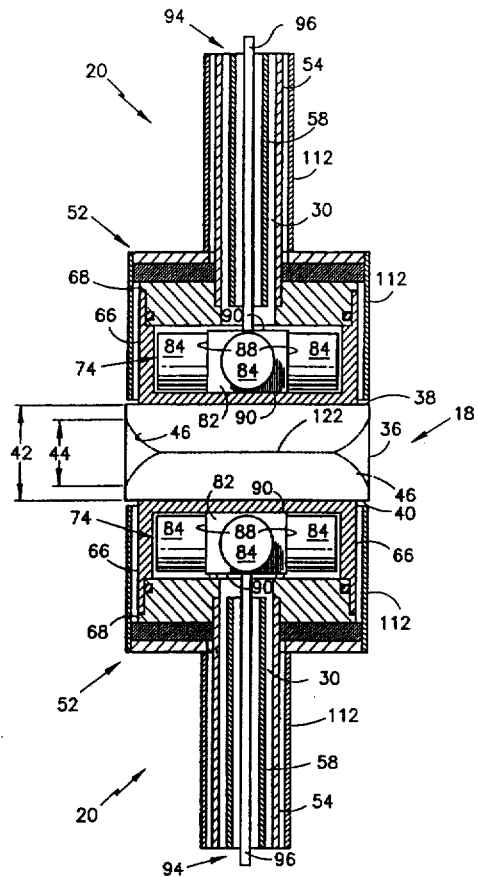

Referring to FIGS. 1 and 2, the cathode 18 is a substantially cylindrical disk having an evaporative surface 36 extending between a pair of end surfaces 38,40. The end surfaces 38,40 are substantially parallel with one another. The coating to be deposited dictates the material composition of the cathode 18, and often the cathode 18 can simply be cut from a cast rod. The axial length 42 of the cathode 18 is preferably longer than the anticipated final width 44 of the erosion pattern 46 along the evaporative surface 36 of the cathode 18. Keeping the erosion pattern 46 between the end surfaces 38,40 minimizes the possibility that the arc will leave the evaporative surface 36 of the cathode 18. The substrates 12 are mounted on a platter 48 that rolls into and out of the vessel 14. The platter 48 includes means for rotating the substrates (not shown).

The contactor 20 includes a head 52 attached to a shaft 54. The head 52 is positioned inside the vessel 14 and the shaft 54 extends from the head 52 to outside the vessel 14. An insulative disk 56 electrically insulates the contactor 20 from the vessel 14. The contactor 20 preferably further includes a cooling tube 58 coaxially positioned within the shaft 54, a coolant inlet port 60 (see FIG. 1) connected to the cooling tube 58, and a coolant exit port 62 connected to the passage 30 formed between the coaxial coolant tube 58 and shaft 54. The coaxial arrangement between the cooling tube 58 and the shaft 54 allows coolant from the coolant supply 26 to enter the cooling tube 58 and return via the passage 30 between the shaft 54 and the cooling tube 58, or vice versa.

Figure 7:
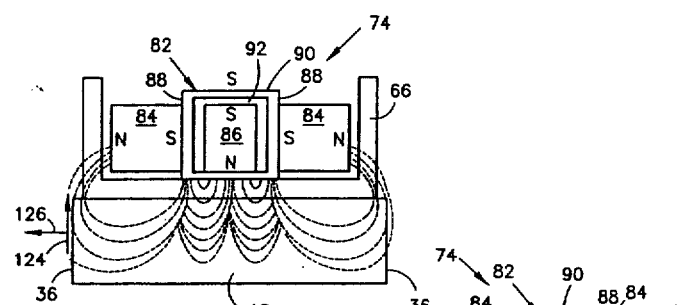
FIG. 7 is a diagrammatic view of a cathode and magnetic field generator with a center magnet, including magnetic field lines permeating the cathode.
Figure 8:
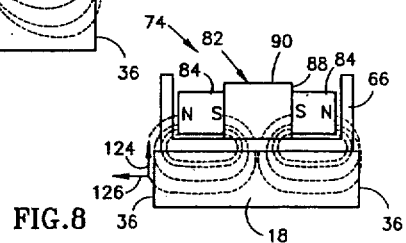
FIG. 8 is a diagrammatic view of a cathode and magnetic field generator, including magnetic field lines permeating the cathode.

Referring to FIGS. 2–8, the contactor head 52 includes a cup 66, a shaft flange 68, and a magnetic field generator 74. The shaft flange 68 is fixed to the shaft 54 and the cup 66 is removably attached to the shaft flange 68. The cup 66, shaft flange 68, and shaft 54 are fabricated from an electrically conductive material such as a copper alloy. The magnetic field generator 74 includes a ferromagnetic center piece 82, a plurality of side magnets 84, and a center magnet 86. The center piece 82 includes at least one side surface 88 extending between two end surfaces 90, and a hollow 92 for receiving the center magnet 86. The side 84 and center 86 magnets are preferably permanent magnets, although alternative magnetic field sources such as electromagnetics may be used. Cylindrical permanent magnets, for example, are advantageous because they are commercially available and relatively inexpensive (see FIGS. 2–4, 7, and 8). An annular magnet, segmented or whole, may be used alternatively (see FIGS. 5 and 6). The side magnets 84 are attached to the side surface 88 and the center magnet 86 is either received within the hollow 92 or attached to an end surface 90. FIG. 8 shows a magnetic field generator 74 that includes a ferromagnetic center piece 82 and side magnets 84, but does not include a center magnet 86. In all embodiments, the number of side magnets 84 can be varied to accommodate the process at hand.

Referring to FIGS. 1 and 2, apparatus 94 is included for rotating the magnetic field generator. The rotation apparatus 94 includes a rod 96 extending through the coolant tube 58 and into the head 52 where it connects with the ferromagnetic center piece 82. The opposite end of the rod 96 is connected to a variable speed drive motor 98 via a drive belt 100 (see FIG. 1).

The cathodic arc coater 10 may also include an actuator 102 for selectively actuating the contactor 20 into electrical contact with the cathode 18 which includes a pair of two-way actuating cylinders 104 (hydraulic or pneumatic) acting between the vessel 14 and a shaft flange 106 attached to the contactor shaft 54. Mechanical apparatus may be used in place of the actuating cylinders 104. A commercially available controller (not shown) can be used to control the position and force of the cylinders 104 (or mechanical apparatus). FIG. 1 shows the cathode 18 disposed between a fixed support 19 and an actuable contactor 20. FIG. 2 shows an alternative cathode 18 arrangement wherein a contactor 20 is in contact with each end surface 38,40 of the cathode 18. The second contactor 20 may be fixed or actuable.

The cathodic arc coater 10 preferably includes a biasing source 108 for electrically biasing the substrates 12. Negatively biasing the substrates 12 relative to the anode 24 makes the substrates 12 electrically attractive to positive ions liberated from the cathode 18. A contact 110 electrically connects the biasing source 108 to the platter 48. The substrates 12, which are electrically connected to the platter 48, are consequently electrically connected to the biasing source 108. Other means for electrically connecting the substrates 12 to the biasing source 108 may be used alternatively.

Deflector shields 112 are used throughout the coater 10 to confine the vaporized cathode materials in the area of the substrates 12. The deflector shields 112 attached to the vessel 14, platter 48, and contactor 20 also minimize undesirable material build-up on those surfaces. In the preferred embodiment, the deflector shields 112 attached to the vessel 14 are electrically connected to the vessel 14 and are made of an electrically conductive material resistant to corrosion, such as stainless steel.

The means 22 for sustaining an arc of electrical energy between the cathode 18 and an anode 24 includes a direct current (D.C.) power supply 114. In the preferred embodiment, the positive lead 115 of the power supply 114 is connected to the vessel 14, thereby making the vessel 14 act as an anode. The negative lead 117 of the power supply 114 is electrically connected to the contactor shaft 52. Alternative embodiments may use an anode (not shown) disposed inside the vessel 14. An arc initiator 116, maintained at or near the electrical potential of the vessel 14, is used to initiate an arc.

II. Operation of the Apparatus

Referring to FIG. 1, in the operation of the present invention cathodic arc coater 10, a plurality of substrates 12 and a cathode 18 are attached to the platter 48 and loaded into the vessel 14. The substrates 12 have been previously degreased and substantially cleaned, although each will likely have some molecular contaminant and oxidation remaining on its exterior surface. The actuating cylinders 104 subsequently actuate the contactor 20 into electrical contact with the cathode 18 and the vessel 14 is closed.

The mechanical rough vacuum pump 32 is operated to evacuate the vessel 14 to a predetermined pressure. Once that pressure is reached, the high volume diffusion vacuum pump 34 further evacuates the vessel 14 to near vacuum conditions. The substrates 12 are then cleaned of any remaining contaminants and/or oxidation by a method such as "sputter cleaning". Sputter cleaning is a process well known in the art and will not be described in detail here. Other cleaning methods may be used alternatively. After the substrates 12 are cleaned, the contaminants are purged typically using an inert gas.

Prior to initiating an arc several steps are completed, including: (1) the substrates 12 are electrically biased via the biasing source 108, making them electrically attractive to positive ions emitted from the cathode 18; (2) the substrates 12 are rotated at a particular rotational speed; (3) the power supply 114 is set to establish an arc having a particular magnitude of current and voltage, but no arc is initiated; (4) the vacuum pumps 32,34 establish and maintain a particular vacuum pressure of gas within the vessel 14; and (5) coolant is cycled through the cooling passages 28,30 within the vessel 14 and contactor 20. Specific process parameters will depend upon factors such as the substrate material, the material to be coated, and the desired characteristics of the coating, etc.

Once the aforementioned steps have been completed, the arc initiator 116 is brought into and out of contact with the evaporative surface 36 of the cathode 18, causing an arc to jump between the arc initiator 116 and the evaporative surface 36. The arc initiator 116 is subsequently moved a distance away from the cathode 18, preferably radially outside of the substrates 12. Once the arc initiator 116 is no longer proximate the cathode 18, the arc jumps between the cathode 18 and the deflector shields 112 electrically connected to the vessel 24 (or directly between the cathode 18 and the vessel 24).

The magnetic field generator 74 positioned in the contactor 20 drives the cathode spot along the evaporative surface 36 of the cathode 18. To be more specific, each side magnet 84 produces a magnetic field that permeates the cathode 18 and runs substantially parallel to the cathode evaporative surface 36. FIGS. 7 and 8 show an approximation of where the magnetic field lines are believed to run and vector 124 represents the magnetic field extending between the cathode end surfaces 38,40. The direction of the magnetic field vector 124 depends upon the orientation of the side magnet 84 poles, and all side magnets 84 are oriented in like manner. A vector 126 representing the electric arc, in contrast, extends away from the evaporative surface 36 in a substantially perpendicular direction. Together, the magnetic field and the electric current of the arc create a force (the Hall effect) on the arc that causes the arc to travel a distance around the circumference of the cathode 18. The dwell time of the arc at any particular cathode spot is inversely related to the Hall effect force; i.e., an increase in the Hall effect force, causes a decrease in the dwell time. A person of skill in the art will recognize that decreasing the dwell time reduces the occurrence of macro-particles which can adversely effect the uniformity and surface finish of the deposited coating.

The individual magnetic fields of the side magnets 84, in close circumferential proximity to one another, collectively force the arc to circle the cathode evaporative surface 36 along an arc path 122 (see FIG. 2). The number of side magnets 84, the relative spacing of magnetic fields emanating from side magnets 84, and the intensity of those magnetic fields can be adjusted to satisfy the application at hand. In some applications, however, it is advantageous to further include a center magnet 86. The magnetic field of the center magnet 86 appears to influence the geometry of the magnetic fields emanating from the side magnets 84. As a result, the arc path 122 around the circumference of the cathode 18 is moved axially away from the side magnets 84. Hence, the center magnet 86 can be used to move the axial position of the arc path 122. FIG. 7 shows an approximation of how the magnetic field lines from the side magnets 84 and center magnet 86 are believed to interact. An arc path 122 proximate the axial midpoint of the cathode 18 helps maintain the arc away from the contactor 20 (or between both contactors 20), thereby minimizing undesirable wear on the contactor 20. An arc path 122 (and consequent erosion geometry) proximate the axial midpoint also helps increase the efficiency of the coating process by maximizing the amount of material that can be eroded from a particular cathode 18.

The energy delivered by the arc causes the material at the cathode spot to vaporize, thereby liberating atoms, molecules, ions, electrons, and particles from the cathode 18. The biased substrates 12 attract the ions, causing them to accelerate toward the substrates 12. The ions strike the exterior surface of the substrates 12, attach, and collectively form a coating of the cathode material.

FIG. 2 shows an eroded cathode 18 in phantom, substantially symmetrical about the arc path 122. In the embodiment which includes apparatus 94 for rotating the magnetic field generator 74, rotation of the magnetic field generator 74 within the contactor 20 helps promote uniform axial and circumferential erosion of the cathode 18. The rotation distributes the magnetic contribution of each side magnet 84 around the circumference of the cathode 18 as a function of time. It must be emphasized, however, that rotation of the magnetic field generator 74 is not required to create a circling arc. As stated above, the individual magnetic fields of the side magnets 84 collectively force the arc to circle the cathode evaporative surface 36.

Referring to FIG. 1, when a coating of sufficient thickness has been deposited on the substrates 12, the power supply 114 is turned off and the arc extinguished. The vessel 14 is purged with inert gas and brought to ambient pressure. The contactor 20 is actuated out of contact with the cathode 18 and the platter 48 is removed from the vessel 14. The substrates 12 are subsequently removed from the platter 48 and new substrates 12 attached. The loaded platter 48 is then inserted back into the vessel 14 in the manner described earlier and the process repeated.

Although this invention has been shown and described with respect to the detailed embodiments thereof, it will be understood by those skilled in the art that various changes in form and detail thereof may be made without departing from the spirit and the scope of the invention. In one example, means for cooling the contactor 20 may be used other than that disclosed in the Best Mode. In another example, a power supply 114 that simulates direct current, such as one having an LCR circuit or other rectifying means, may be used in place of a D.C. power supply 114. In another example, the Best Mode discloses one or both contactors 20 as actuable. In some cases, however, it may be acceptable to have stationary contactors 20.

I claim:

1. An apparatus for applying material by cathodic arc vapor deposition to a substrate, comprising:
    a vessel;
    means for maintaining a vacuum in said vessel;
    a disk-shaped cathode, positioned inside said vessel, having a first end surface, a second end surface, and an evaporative surface axially extending therebetween;
    means for selectively sustaining an arc of electrical energy between said evaporative surface and an anode;
    means for driving said arc around said evaporative surface along an arc path, having a magnetic field generator attached to a ferromagnetic center piece, wherein said magnetic field generator includes a plurality of side magnets attached to said ferromagnetic center piece, and a center magnet positioned radially inside of said side magnets;
    wherein each said side magnet produces a magnetic field that permeates said cathode, each said magnetic field including a portion that runs substantially parallel to said evaporative surface; and
    wherein said center magnet influences said arc path relative to said axially extending evaporative surface; and
    wherein said arc of electrical energy extending between said cathode and said anode liberates a portion of said cathode which is subsequently deposited on the substrate located inside said vessel.

2. An apparatus according to claim 1, wherein said means for sustaining an arc of electrical energy between said cathode and said anode comprises:
    a power supply, having a positive lead and a negative lead;
    wherein said negative lead of said power supply is electrically connected to cathode, and said positive lead is electrically connected to said vessel, thereby making said vessel act as said anode; and
    wherein said cathode is electrically insulated from said vessel.

3. An apparatus according to claim 2, wherein said magnets are permanent magnets.

4. An apparatus according to claim 3, wherein said ferromagnetic center piece comprises a hollow and said center magnet is disposed in said hollow.

5. An apparatus according to claim 4, wherein said center magnet is cylindrically shaped, having a first polar end and a second polar end, said second polar end having a polarity opposite that of said first polar end;
    wherein said first polar end of each said magnet is are attached to said ferromagnetic center piece.

6. An apparatus according to claim 5, further comprising:
    a protective coating, said coating encasing said ferromagnetic center piece and said magnets to inhibit corrosion of said ferromagnetic center piece and said magnets.

7. An apparatus according to claim 3, wherein said center magnet is attached to an end surface of said ferromagnetic center piece.

\* \* \* \* \*

UNITED STATES PATENT AND TRADEMARK OFFICE
CERTIFICATE OF CORRECTION

PATENT NO. : 6,009,829
DATED : January 4, 2000
INVENTOR(S) : Subbiah Ramalingam

It is certified that error appears in the above-identified patent and that said Letters Patent is hereby corrected as shown below:

Please substitute the attached drawing sheets.

Signed and Sealed this

Twenty-second Day of May, 2001

Attest:

NICHOLAS P. GODICI

Attesting Officer     Acting Director of the United States Patent and Trademark Office